United States Patent [19]

Kawai et al.

[11] Patent Number: 5,146,429

[45] Date of Patent: Sep. 8, 1992

[54] SEMICONDUCTOR MEMORY DEVICE INCLUDING A REDUNDANCY CIRCUITRY FOR REPAIRING A DEFECTIVE MEMORY CELL AND A METHOD FOR REPAIRING A DEFECTIVE MEMORY CELL

[75] Inventors: Shinji Kawai; Shigeru Mori; Shigeru Kikuda, all of Hyogo, Japan

[73] Assignee: Mitsubishi Denki Kabushiki Kaisha, Tokyo, Japan

[21] Appl. No.: 617,737

[22] Filed: Nov. 26, 1990

[30] Foreign Application Priority Data

Aug. 2, 1990 [JP] Japan .................................. 2-206157

[51] Int. Cl.$^5$ ............................................. G11C 13/00
[52] U.S. Cl. ....................................... 365/200; 365/96
[58] Field of Search ....................... 365/189.01, 200, 96

[56] References Cited

U.S. PATENT DOCUMENTS 4,389,715  6/1983  Eaton et al.

OTHER PUBLICATIONS

"An Ultralow Power 8K X 8-Bit Full CMOS RAM with a Six-Transistor Cell", IEEE Journal of Solid-State Circuits, vol. SC-17, No. 5, Oct. 1982, by Kiyofumi Ochii et al., pp. 797-803.

"32K and 16K Static MOS RAMs Using Laser Redundancy Techniques", by Richard J. Smith et al, 1982 Digest of Technical Papers, Feb. 10-12, 1982, pp. 252-253.

*Primary Examiner*—Terrell W. Fears
*Attorney, Agent, or Firm*—Lowe, Price, LeBlanc & Becker

[57] ABSTRACT

A semicondcutor memory device includes an array of a plurality of memory cells arranged in a matrix manner, and a row or column decoder responsive to an external address signal for generating a row or column selecting signal. The memory cell array comprises (n+1) rows or columns. The row or column decoder comprises n output nodes. Transmission gates are provided between the decoder output node and row lines or column selecting lines for connecting each output node and each row line or column selecting line. The transmission gates are formed of a pair of CMOS transmission gates, whereby one output node is connected to two adjacent row lines or column selecting lines. This memory device further includes a circuit defining the connection manner of the transmission gate. This defining circuit turns one pair of CMOS transmission gates ON and OFF complementally. When there is a defective memory cell, the decoder output nodes are grouped into a first group including the output node corresponding to the faulty row or column having the defective memory cell, and a second group formed of the remaining output nodes. The defining circuit applies control signals to the CMOS transmission gates so that the ON/OFF states of the CMOS transmission gate pair related to the first group of output nodes and the CMOS transmission gate pair related to the second group of output node differ. The memory device further includes switching devices provided corresponding to each row line or column selecting line, responsive to the control signal from the defining ciruciut to be turned on/off. This switching device connects only the faulty row line or the faulty column selecting line to the reference potential fixedly.

12 Claims, 5 Drawing Sheets

SEMICONDUCTOR MEMORY DEVICE INCLUDING A REDUNDANCY CIRCUITRY FOR REPAIRING A DEFECTIVE MEMORY CELL AND A METHOD FOR REPAIRING A DEFECTIVE MEMORY CELL

BACKGROUND OF THE INVENTION

1. Cross Reference

The subject matter related to this application is disclosed in a pending U.S. patent application Ser. No. 500,965, filed on Mar. 29, 1990, invented by Shuji Murakami et al., assigned to the same applicant.

2. Field of the Invention

The present invention relates to a circuit structure for repairing a defective memory cell (faulty bit) in a semiconductor memory device.

3. Description of the Background Art

A semiconductor memory device is generally provided with a spare row and a spare column in the memory cell array for repairing a defective memory cell (faulty bit) from the stand point of yield and the like.

Such a redundancy scheme for repairing a defective memory cell is disclosed in U.S. Pat. No. 4,389,715 entitled "Redundancy Scheme For a Dynamic RAM" issued on Jun. 21, 1985, invented by Eaton et al. and assigned to Inmos Corporation; an article entitled "32 K and 16 K Static MOS RAMs using Laser Redundancy Techniques" by R. J. Smith et al. in 1982 IEEE International Solid State Circuits Conference Digest of Technical Papers, Feb. 12, 1982, pages 252 and 253; and an article entitled "An Ultralow Power 8 K×8 bit Full CMOS RAM with a Six-Transistor Cell" by K. Ochii et al. in IEEE Journal of Solid-State Circuits, Vol. SC-17 No. 5, October, 1982, pages 798 to 803.

FIG. 1 shows a schematic overview of a memory device comprising the redundancy scheme disclosed by R. J. Smith et al. This memory device comprises a SRAM (static random access memory) cell.

Referring to FIG. 1, a conventional semiconductor memory device comprises a memory cell array 1 having a plurality of memory cells MC arranged in n rows and m columns. Memory cell array 1 is provided with n rows R1-Rn each having a row of memory cells connected thereto and m columns C1-Cm each having a column of memory cells connected thereto. Memory cell array 1 is also provided with a spare row SR and a spare column SC in predetermined positions (the 1st row and the m+1-th column in FIG. 1) for repairing a defective memory cell. Each of rows R1-Rn is connected to the output signal lines (output nodes) X1-Xn of row decoder 3. The row decoder 3 decodes externally applied X address signals (row address signals) A0-Ak, to select one line out of the output signal lines X1-Xn according to the decoded result.

Each of columns C1-Cm is connected to the output signal lines (the column selecting signal transmission line) Y1-Ym of a column decoder 6. Column decoder 6 decodes externally applied Y address signals (column address signals) B0-Bj to select one line out of the output signal lines Y1-Ym according to the decoded result and activates the selected output signal line.

The output signal lines Y1-Ym of column decoder 6 are connected to the gates of column selecting gates 90a and 90b for selectively connecting columns C1-Cm to the common data line (not shown) in response to the output signal of column decoder 6. Column selecting gate 90a connects bit line BLp of column Cp (P=1−m) to the common data line, whereas column selecting gate 90b connects the complementary bit line $\overline{BIp}$ of column Cp to the complementary common data line. The group of gates formed of column selecting gates 90a and 90b implement a column selecting gate 9.

The output signal of column decoder 6 is transmitted to column selecting gate 9 via fuses f1-fm. Fuses f1-fm can be melted by a laser beam, for example. A high resistor r is provided in parallel with fuses f1-fm to maintain the gate potential of column selecting gates 90a and 90b connected to the melted fuse at ground potential level when an associated fuse is melted.

For the purpose of repairing the row including the faulty bit, a program circuit 30, a spare row decoder 31, and a spare row driver SXD are provided. Program circuit 30 stores the address of the row comprising the faulty bit. Program circuit 30 generally comprises a structure similar to that of a unit row decode circuit forming row decoder 3. The storage of the address of the row comprising the faulty bit in program circuit 30 is often carried out by melting the fuses included therein by a laser beam.

The spare row decoder 31 provides a signal NED which brings row decoder 3 to a non-activation state, and also a spare row selecting signal, in response to the activation signal from program circuit 30. The spare row driver SXD is responsive to the spare row selecting signal from spare row decoder 31 to drive spare row SR, whereby spare row SR attains a selected state (activation state).

A program circuit 61 and a spare column decoder 60 are provided for the purpose of selecting spare column (redundancy column) SC. Program circuit 61 stores the address of the column comprising the defective memory cell to provide an activation signal when external Y address signal B0-Bj designates the column including the defective memory cell. Spare column decoder 60 provides a signal which selects the spare column SC in response to the activation signal from program circuit 61. The operation thereof will be explained hereinafter.

First, the operation in the case where a defective memory cell does not exist will be explained. Row decoder 3 decodes externally applied X address signals A0-Ak to provide a signal which selects one of rows R1-Rn to one line of output signal lines X1-Xn. This causes the potential in row Ri (the selected row is Ri) to rise, whereby row Ri attains the selected state. The information in the memory cell MC connected to this selected row Ri is read out to each columns C1-Cm.

Column decoder 6 decodes externally applied Y address signals B0-Bj, whereby the signal potential of one of the output signal lines Y1-Ym is raised in response to the Y address decode signal. The selected column is assumed to be Ci. The potential of the output signal line Yi of column decoder 6 rises to turn on the column selecting gates 90a and 90b, whereby column Ci is connected to the common data line. Then, the data of the memory cell located at the intersection of the selected row Ri and the selected column Ci is read out or written. This data reading is carried out using a sense amplifier or the like which is not shown.

The case where a defective memory cell exists in the memory cell connected to row Ri will be considered hereinafter. The presence/absence of a defective memory cell is detected by a function test of the semiconductor memory device. At this time, the address of row Ri where the defective memory cell is present will be written into program circuit 30 for row repairing. The writing of the address to program circuit 30 is carried out by melting the fuses with a laser, as is mentioned above.

When the externally applied X address signal A0–Ak designates row Ri, program circuit 30 is activated to operate spare row decoder 31. The spare row decoder 31 in the operation state brings spare row SR to the selected state via spare row driver SXD, and also activates signal NED to bring row decoder 3 to a non-activation state. This replaces row Ri comprising the defective memory cell with the spare row SR, whereby the repair of the faulty row Ri is performed.

The case where a defective memory cell exists in column Ci is considered hereinafter. Similar to the repair of the row, the address of column Ci comprising the defective memory cell is written into program circuit 61 for column repair by disconnection of a fuse, for example. At this time, fuse fi connected to the output signal line Yi for selecting column Ci comprising the defective memory cell is also disconnected, as shown in FIG. 2, whereby the faulty column Ci is detached from column decoder 6. The output signal line Yi corresponding to the faulty column Ci is connected to a reference potential, for example, ground potential, via resistance r, whereby the faulty column Ci will always be at the non-selected state.

When the externally applied Y address signals B0–Bj designates column Ci, spare column decoder 60 operates via program circuit 61 to select spare column SC. Although column decoder 6 also operates at this time, the faulty column Ci is at the non-selected state because the output signal line Yi is detached from column decoder 6. By the output of spare column decoder 60, spare column SC is selected to replace column Ci comprising the defective memory cell with spare column SC. Thus, the repair of the faulty column Ci is performed.

The faulty bit repairing circuit implemented in the above manner in a conventional semiconductor memory device requires a program circuit for storing the faulty row or the faulty column, a spare row decoder for driving a spare row, and a spare column decoder for driving a spare column, leading to a problem of increasing the chip area.

The programming of the faulty row address or the faulty column address in the program circuit is generally carried out by disconnecting the fuse. However, the number of fuses comprised in the program circuit is great, as shown in the examples of the aforementioned Smith et al. or Ochii et al. literatures, increasing the number of fuse disconnections for programming the faulty row or faulty column. Because the programming of the faulty row or the faulty column is such that is carried out by each chip, reduction in throughput during the repairing work, and error in the fuse disconnecting position is likely to occur. This results in the problem that the repair success rate is reduced to lower the yield of the semiconductor memory device.

At the time of row repairing when a faulty row (Xi) is selected, the row decoder is non-activated by signal NED from the spare row decoder, as shown in FIG. 3. Because the row decoder is first activated, and then non-activated in response to signal NED, the faulty row including the defective memory cell will also be once selected. To prevent the effect of the selection of the row comprising the defective memory cell, it was necessary to connect the selected memory cell to the common data line after the faulty row is definitely in the non-selected state, that is, after the signal potential of the selected row is established. This results in the problem that the access time TA becomes longer.

The output signal line of the column decoder is provided with a resistor of high resistance for the purpose of maintaining the faulty column at the nonselected state definitely. Because this resistor of high resistance is provided in every column decoder output signal line, current will flow through this resistor of high resistance at the time of column selection, resulting in a problem that current consumption is increased.

SUMMARY OF THE INVENTION

An object of the present invention is to provide a semiconductor memory devise comprising a redundancy circuit for repairing defective memory cells, without the drawbacks of the aforementioned conventional defective memory cell repairing circuits in a semiconductor memory device.

Another object of the present invention is to provide a semiconductor memory device comprising a redundancy circuit for repairing defective memory cells, improving the throughput during row or column repairing operation, and the repair success rate.

A further object of the present invention is to provide a semiconductor memory device comprising a redundancy circuit for repairing defective memory cells, without having inferior effect to access time and power consumption.

A still further object of the present invention is to provide a semiconductor memory device comprising a redundancy circuit for repairing defective memory cells, reducing the number of fuse disconnection sections for repairing faulty rows and faulty columns, allowing easy and precise row or column repairing.

Another object of the present invention is to provide a method of repairing a defective memory cell readily and precisely.

A further object of the present invention is to provide a method of repairing defective memory cells without increasing access time and power consumption.

In summary, a semiconductor memory device comprising a redundancy circuit in accordance with the present invention comprises a memory cell array with at least (n+1) row lines (row) or column lines (column) associated with n rows or columns of decoder output signal lines, and selective connecting means provided between n decoder circuit output signal lines and (n+1) row or column lines. This selective connecting means selectively connects one decoder circuit output signal line to adjacent row lines or column lines in succession. A defining circuit is provided to define the connecting manner of this selective connecting means. The defining circuit defines the connection manner of the connecting circuit so that the decoder circuit output signal lines are connected to the adjacent row or column lines in one-to-one correspondence in succession excluding the row or column line comprising the defective memory cell.

In this selective connecting means, the defining circuit defines the connection manner so that the connection path is different in a first group of output signal lines including the decoder circuit output signal line corresponding to the row line or column line comprising the defective memory cell, and a second group constituted by the remaining output signal lines.

The semiconductor memory device comprising a redundancy circuit in accordance with the present invention further comprises devices provided corresponding to each row line or column selecting line for connecting only the row line or the column selecting line comprising the defective memory cell to the reference potential in response to the output signal from the defining circuit.

A method of repairing a defective memory cell in accordance with the present invention in a semiconductor memory device including an address decoder circuit having n output nodes, and a memory cell array having at least (n+1) row lines or column selecting lines, comprises the steps of grouping the output nodes of the address decoder circuit into a first group including the output node corresponding to the faulty row line or faulty column selecting line connected to the defective memory cell, and a second group formed by the remaining output nodes, when a defective memory cell exists; connecting the output nodes of the second group to the row lines or column selecting lines in a state similar to that when no defective memory cell exists, and connecting each output node of the first group to the row line or column selecting line so as each output node of the first group has the corresponding connection shifted by one line; whereby the faulty row line or the faulty column selecting line is detached from the address decoder circuit; and connecting only the faulty row line or the faulty column selecting line to the reference potential permanently.

In the above mentioned structure, the defining circuit has a connecting path in the selective connecting means which differs for the first group of output signal lines and the second group of output signal lines. This causes the row line or the column line comprising the defective memory cell to be disconnected from the decoder circuit. The decoder circuit output signal lines are shifted by one line from the boundary of the row or column line comprising the defective memory cell to be connected to the decoder circuit output signal lines in one-to-one correspondence. Thus, repair of the faulty row or faulty column comprising the defective memory cell is done.

The faulty row line or the faulty column selecting line is connected to the reference potential by the reference potential connecting device, while the remaining normal row lines and column selecting signal lines are disconnected from the reference potential, whereby through current will not be generated at the time of row or column selection, and the faulty row line or the faulty column line can be maintained at a non-selected state permanently and positively.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
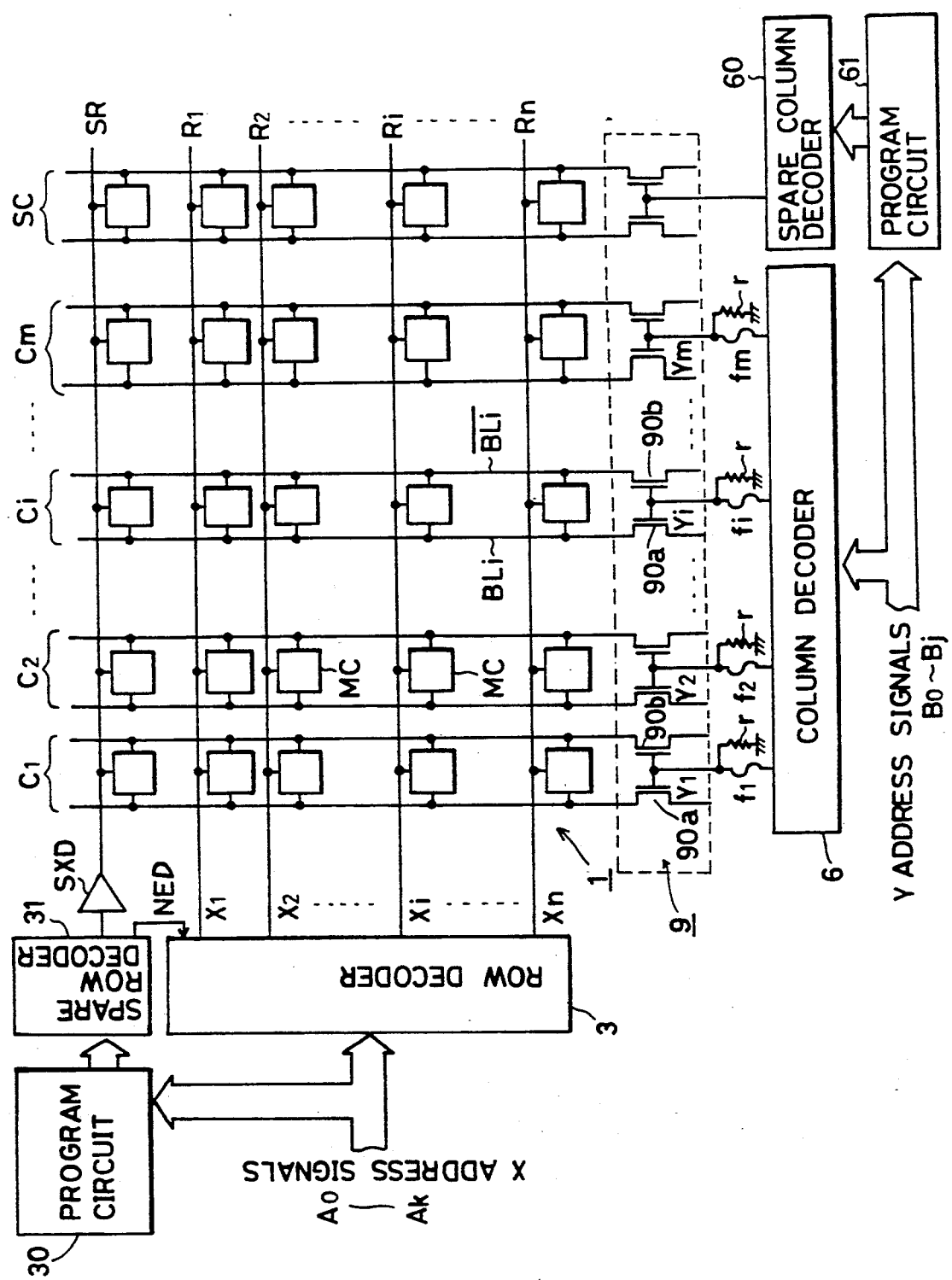
FIG. 1 is a schematic diagram of the entire structure of a conventional semiconductor memory device comprising a redundancy circuit for repairing a defective memory cell.
Figure 2:
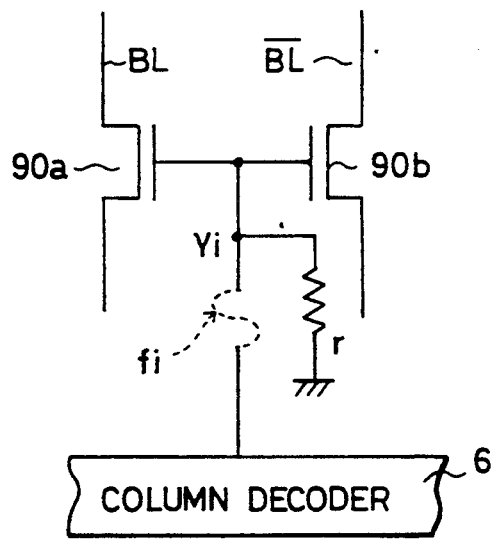
FIG. 2 shows a method of repairing a defective memory cell in a conventional semiconductor memory device.
Figure 3:
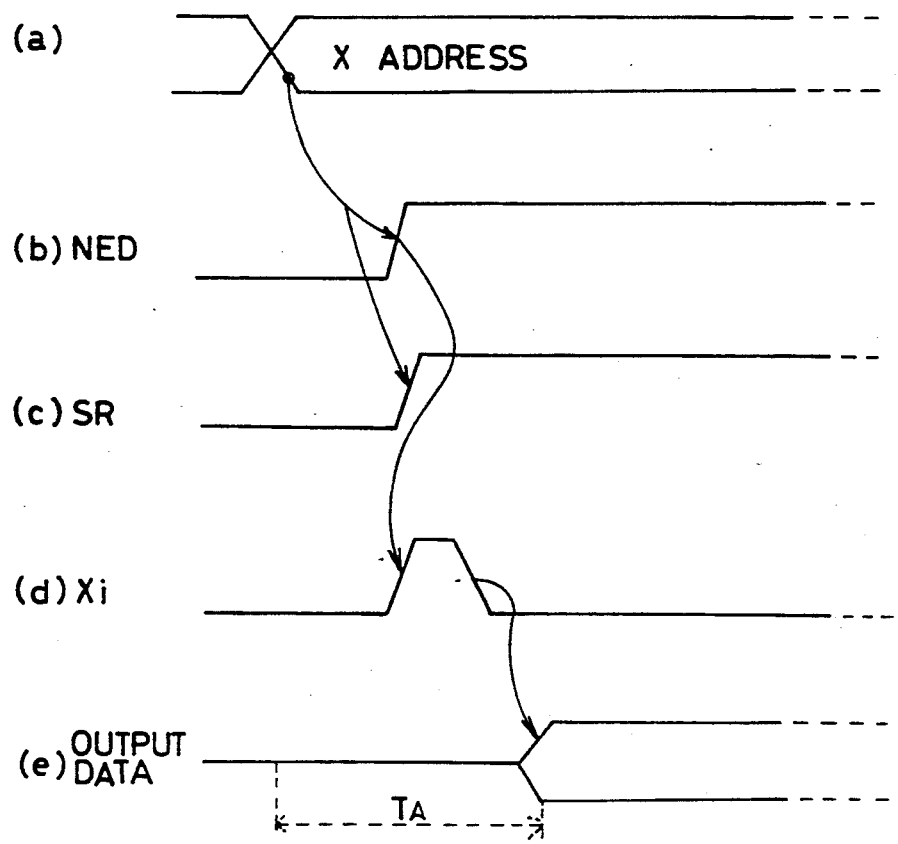
FIG. 3 shows the problems in a conventional semiconductor memory device comprising a redundancy circuit.
Figure 4:
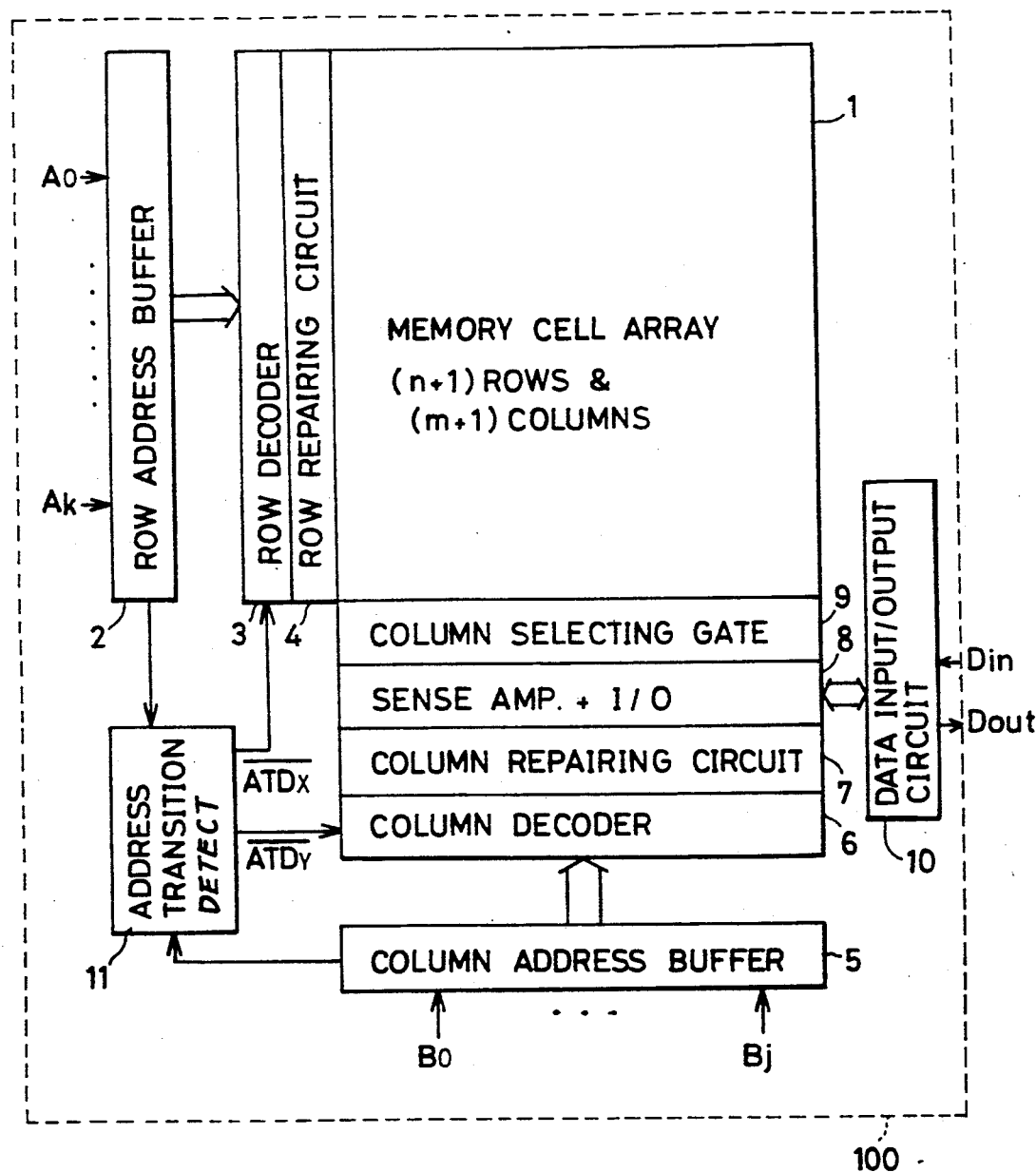
FIG. 4 shows the entire structure of a semiconductor memory device comprising a redundancy circuit in accordance with one embodiment of the present invention.

FIG. 4 shows a schematic diagram of the entire structure of a semiconductor memory device comprising a redundancy circuit according to one embodiment of the present invention. In FIG. 4, the semiconductor memory device comprises a memory cell array 1 having memory cells of (n+1) rows and (m+1) columns arranged in a matrix manner. The memory cell array 1 comprises a spare row and a spare column with their positions not fixed, as will be described in details later.

A row address buffer 2, a row decoder 3, and a row repairing circuit 4 are provided to select a row in the memory cell array 1. Row address buffer 2 receives externally applied row address signals A0-Ak to generate an internal row address signal. Row decoder 3 decodes the internal row address signal from row address buffer 2 to select a corresponding row in the memory cell array 1, to which an activation signal (selecting signal) is transmitted.

Row repairing circuit 4 is provided between the outputs of row decoder 3 and the rows of memory cell array 1 to transmit an output of row decoder 3 into each row of memory cell array 1 so that the faulty row can always be at the non-selected state.

A column address buffer 5, a column decoder 6, a column repairing circuit 7, a sense amplifier-and-I/O block 8, and a column selecting gate 9 are provided to select a column of memory cell array 1. Column address buffer 5 receives externally applied column address signals B0-Bj to generate an internal column address signal. Column decoder 6 decodes the internal column address signal from column address buffer 5 to generate a signal which selects the corresponding column in the memory cell array 1.

Column repairing circuit 7 keeps the faulty column always at the non-selected state, and transmits an output of column decoder 6 to column selecting gate 9.

Column selecting gate 9 is responsive to the column selecting signal transmitted from column repairing circuit 7 to connect the corresponding column in memory cell array 1 to the common data line (I/O, $\overline{I/O}$) of block 8. The sense amplifier comprised in block 8 amplifies the information of the selected column.

A data input/output circuit 10 is provided for sending and receiving data with external devices. Data input/output circuit 10 receives externally applied input data Din and transmits the same to the selected memory cell via block 8. Data input/output circuit 10 receives data amplified by sense amplifier 8 included in block 8 to provide output data Dout.

An address transition detecting circuit 11 is provided for defining the timings of row selection and column selection in the semiconductor memory device. Address transition detecting circuit 11 monitors the internal row address from row address buffer 2 to detect the transition point, and generates a row address transition detecting signal ATDx. Address transition detecting circuit 11 receives the internal column address signal from column address buffer 5 to detect the transition of the internal column address signal, and provides a column address transition detecting signal ATDy.

Although a semiconductor memory device of a static type random access memory is described in the embodiment of the present invention, the structure of the present invention can be applied to dynamic type random access memory, as well as to any semiconductor memory device having memory cells arranged in a matrix manner of rows and columns.

Figure 5:
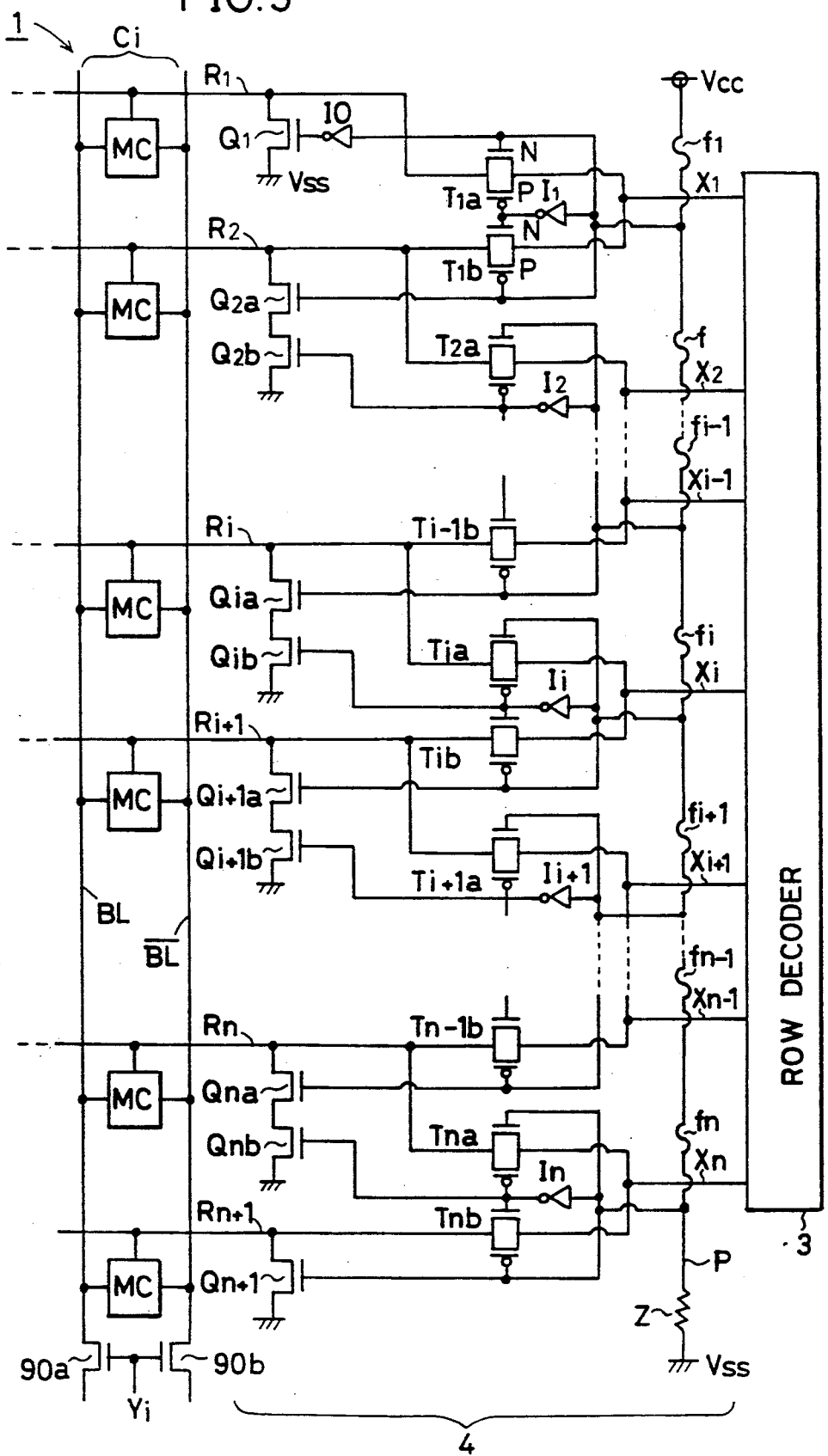
FIG. 5 shows a redundancy circuit for row repair and the relating circuitry of one embodiment of the present invention.

The broken line block 100 in FIG. 4 shows a semiconductor chip. FIG. 5 shows a specific structure of the row repairing circuit 4 of FIG. 4.

Referring to FIG. 5, row decoder 3 comprises n output signal lines (output nodes) X1-Xn. Memory cell array 1 comprises one spare row, and (n+1) row lines R1-Rn+1. Only one column Ci is shown typically in FIG. 5. Column Ci comprises a complementary bit line pair BL, $\overline{BL}$. Memory cell MC is provided at each intersection of column Ci and row lines R1-Rn+1.

The bit line pair BL, $\overline{BL}$ of column Ci are provided with column selecting gate transistors 90a, 90b which will be turned to the on-state in response to the column selecting signal Yi from column decoder (reference no. 6 in FIG. 4). Column Ci is connected to the sense amplifier via the common data lines I/O, $\overline{I/O}$ included in block 8 of FIG. 4 (at the time of data reading), when the column selecting gate transistors 90a, 90b are turned to the on-state.

A redundancy circuit (repairing circuit) 4 is provided between row decoder output signal lines X1-Xn and rows R1-Rn+1.

The row repairing circuit (redundancy circuit) 4 comprises CMOS transmission gates T1a-Tna and T1b-Tnb as column selecting signal transmitting means, a voltage supply path P as means for defining the connection manner of each device of the row selecting signal transmitting means, and switching transistors Q1, Q2a-Qna, Q2b-Qnb, and Qn+1 formed of n channel MOSFETs (insulating gate type field effect transistor) as device means for connecting the faulty row to a reference potential such as ground potential.

CMOS transmission gates T1a-Tna transmits the signals on the output signal lines X1-Xn of row decoder 3 to rows R1-Rn, respectively. CMOS transmission gates T1b-Tnb transmits the signal potential on the output signal lines X1-Xn of row decoder 3 to rows R2-Rn+1, respectively. In other words, CMOS transmission gates T1b-Tnb comprise the function to transmit the signals of output signal lines X1-Xn of row decoder 3 with one line shifted. CMOS transmission gates T1a-Tna comprises the function to directly connect output signal lines X1-Xn of row decoder 3 to the corresponding rows R1-Rn.

CMOS transmission gates Tha-Thb (h=1-n) operate in pairs in a complementary manner to transmit the signal potential on the output signal line Xh of row decoder 3 to row Rh or Rh+1. One row Rh+1 can be connected to output signal line Xh or Xh+1 of row decoder 3 via CMOS transmission gates Tha or Th+1a.

An invertor Ih(I1-In) is provided to selectively turn either of CMOS transmission gates Tha/Thb to a conductive state. When the output of invertor Ih is at the H level, CMOS transmission gate Thb turns to the conductive state. When it is at L level, the CMOS transmission gate Tha is turned to the conductive state.

Voltage supply path P comprises fuse elements f1-fn connected in series between the other reference potential Vcc and one reference voltage Vss which are the operating power supply voltage for example, and a resistor Z of high resistance connected between fuse element fn and one reference potential Vss.

Fuse elements f1-fn are provided corresponding to output signal lines X1-Xn, respectively. The node of fuse element fh which is closer to resistor Z is connected to invertor Ih and the conduction control terminals of CMOS transmission gates Tha, Thb so that only either of CMOS transmission gates Tha, Thb is turned to the conductive state. That is to say, the output of invertor Ih is commonly connected to the gates of pMOS transistor of transmission gate Tha and nMOS transistor of transmission gate Thb. The node of fuse element fh which is nearer to resistor Z of high resistance is connected to each gate of NMOS transistor of transmission gate Tha and PMOS transistor of transmission gate Thb.

The high resistance resistor Z has a sufficiently high resistance value that current flowing therethrough has a negligible level.

Switching device Q1 is turned to the on-state in response to the output of invertor I0 to connect the potential of row R1 to the reference potential Vss. The potential of the node of fuse element f1 closer to resistor Z is transmitted to the input of invertor I0. Because invertor I0 and invertor I1 provide signals of identical signal levels, switching device Q1 is turned to the on-state when CMOS transmission gate Tha is brought to a cut-off state.

Row Rh+1 (h=1-n-1) is provided with switching devices Qh+1a and Qh+1b. Switching devices Qh+1a and Qh+1b are connected in series. The potential of the node of fuse element fh closer to resistor Z is transmitted to the gate of switching device Qh+1a, whereas the potential of the node of fuse element fh+1 closer to resistor Z is transmitted to the gate of switching device Qh+1b via invertor Ih+1. Switching device Qh+1a is turned to the on-state when CMOS transmission gate Thb is brought to a cut-off state, whereas switching device Qh+1b is turned to the on-state when CMOS transmission gate Th+1a is brought to a cut-off state. In other words, both switching devices Qh+1a, Qh+1b are turned to the on-state only when determination is made that row Rh+1 is a faulty row, whereby row Rh+1 is connected to reference potential Vss.

Row Rn+1 is provided with a switching device Qn+1 which connects row Rn+1 to reference potential Vss when turned to the on-state in response to the node potential of fuse element fn closer to resistor Z. The operation thereof will be explained hereinafter.

CMOS transmission gates T1a-Tna, T1b-Tnb have the function to directly transmit the applied signals without losing the voltage level thereof. Accordingly, the row selecting signal provided from row decoder 3 is transmitted to the selected row without signal loss.

The case where a defective memory cell does not exist in memory cell array 1, that is to say, where no faulty row exists is considered hereinafter. Fuse element f1-fn of voltage supply path P are all in the conductive state. The resistor Z has a sufficient high resistance value. At this time, the node potential of fuse element f1-fn closer to resistor Z is at the H level of the other reference potential Vcc level. CMOS transmission gates T1a-Tna are conductive, whereas CMOS transmission gates T1b-Tnb are non-conductive during this state. Accordingly, each of output signal lines X1-Xn of row decoder 3 is connected to rows R1-Rn, respectively.

Switching device Q1 is in the off-state by the function of invertor I0. Switching devices Q2a-Qna are ON due to the node potential of fuse element f1-fn closer to resistor Z. Switching devices Q2b-Qnb are OFF due to the function of invertors I2-In. As a result, each of rows R2-Rn is disconnected from reference potential Vss.

Switching device Qn+1 is ON because the node potential of fuse element fn closer to resistor Z is at the H level, and the potential of row Rn+1 is set to the reference potential Vss. As a result, no floating-up of the potential due to noise and the like of spare row Rn+1 is implemented, as well as elimination of through current during the selection of rows R1-Rn.

Next, the case where a defective memory cell exists in row Ri is considered. Row Ri, i.e., fuse element fi corresponding to the output signal line Xi of row decoder 3 is disconnected at this time. Fuse elements f1—fi−1 are connected to the other reference potential Vcc, by which the potentials are at the H level. Fuse elements fi+1−fn are connected to reference potential Vss by resistor Z. Therefore, the level of the potential from the node of fuse element fi+1 more distant from resistor Z to resistor Z are at the L level.

The applying state of the control signals associated with CMOS transmission gates T1a-Ti−1a and T1b-Ti−1b are similar to that of normal states, where CMOS transmission gates T1a-Ti−1a are conductive and CMOS transmission gates T1b-Ti−1b are OFF. Therefore, output signal lines X1-Xi−1 are connected to rows R1- Ri−1, respectively.

Meanwhile, the level of the conduction control signal with respect to CMOS transmission gates Tia-Tna, Tib-Tnb are opposite to that of the normal state, wherein CMOS transmission gates Tia-Tna are non-conductive and CMOS transmission gates Tib-Tnb are conductive. This causes the output signal lines Xi-Xn of row decoder 3 to be connected to rows Ri+1-Rn+1, respectively. Switching device Qn+1 is OFF at this time because a L level signal is applied to the gate thereof.

The faulty row Ri is electrically disconnected from the output signal line (output node) of row decoder 3 because CMOS transmission gates Ti-1b and Tia are both non-conductive. Switching device Qia are ON by receiving a H level signal at the gate thereof, whereas switching device Qib is ON by receiving a H level at the gate thereof via invertor Ii. This causes the faulty row Ri to be connected to reference potential Vss. This implementation prevents the floating-up of the potential due to noise and the like of the faulty row to maintain the non-selected states of the faulty row positively.

When CMOS transmission gate Thb is conductive and CMOS transmission gate Th+1a is non-conductive, switching device Qh+1a is turned OFF and switching device Qh+1b is turned ON. Therefore, as in the normal state, the path from row Rh+1 to reference potential Vss in which the through current is generated at the time of selection, does not exist in the case of the normal row Rh+1 which does not have a defective memory cell, leading to reduction in power consumption.

The resistor Z of high resistance may be implemented with polysilicon, or a structure can be employed where a MOS transistor is resistor-connected so as to function as a load. In the case where a MOS transistor is used as a resistor Z of high resistance, a structure may be established conducting the MO transistor to connect voltage supplying path P to reference potential Vss, only at the time of faulty row selection.

A circuit for latching reference potential Vcc may be provided between fuse element f1 and reference potential Vcc for the purpose of preventing malfunction of the CMOS transmission gate due to change in the reference potential Vcc.

From the foregoing, the repair of a faulty row can be carried out by disconnecting only one fuse in the repairing circuit (redundancy circuit) of FIG. 5. According to this repairing method, the output signal lines X1-Xn of row decoder 3 are implemented so as to be all connected to normal rows. Therefore, even if a faulty row is designated, a row adjacent to this faulty row is selected instead, that is to say, the faulty row will not be selected, eliminating the need to generate signal NED for turning row decoder 3 to a non-selected state. This results in reduction of access time, due to the fact that there is no need to turn row decoder 3 to a non-selected state, and that the time for the potential of the faulty row to stabilize to the non-selected state does not have to be considered.

Figure 6:
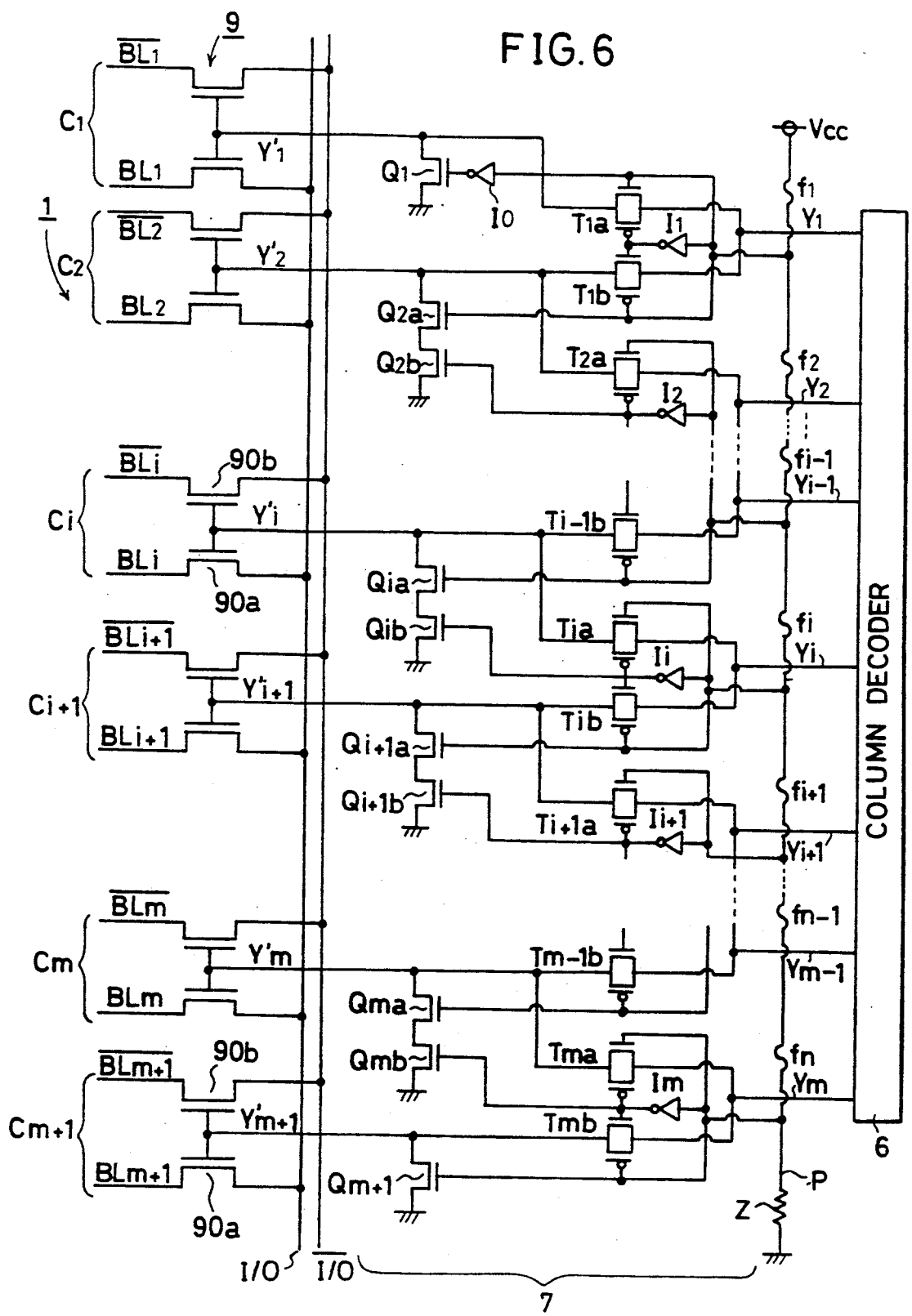
FIG. 6 shows a redundancy circuit for repairing a faulty column and the relating circuitry of one embodiment of the present invention.

Although a structure for repairing a faulty row is shown in FIG. 5, this structure can be used for the repair of a column using a similar structure. FIG. 6 shows a structure for faulty column repair. The elements in FIG. 6 corresponding to those in FIG. 5 have identical reference numbers denoted.

Referring to FIG. 6, column decoder 6 comprises m column selecting signal output nodes Y1-Ym. Memory cell array 1 comprises m+1 columns. There are m+1 column selecting signal transmission lines Y'1-Y'm+1 corresponding to the m+1 columns. The structure of the column repairing circuit between output signal nodes Y1-Ym of column decoder 6 and column selecting signal transmission lines Y'1-Y'm+1 is similar to that shown in the row repairing circuit of FIG. 5, wherein a similar description can be given with column selecting signal transmission lines Y'1-Y'm+1 corresponding to rows R1-Rn+1. It can be said that the structures of the repairing circuits of FIG. 5 and FIG. 6 are similar, except that the number of switching devices and fuse elements of the CMOS transmission gate differs. Because the operation principle thereof is also identical, the description will be omitted.

In the semiconductor memory device of the present invention, selective connecting means are provided so as to connect the output line of the row decoder or the column decoder to the adjacent row or column avoiding the faulty row or faulty column, and switching devices having the operations thereof controlled by a signal identical to the selective connecting means control signal are provided in each row or column selecting signal line so as to connect the faulty row or the column selecting signal line of the faulty column to reference potential, while the remaining normal rows or column selecting signal lines are implemented so as to turn the switching device OFF to block the through current path. Therefore, it is possible to decrease the power consumption of the row or column repairing circuit (redundancy circuit). Because the connection manner of the selective connecting means can be defined by disconnecting in only one place the fuse elements provided in the voltage supplying path, the program circuit for storing the faulty row or the faulty column, a spare row for repairing a faulty row or column, a column decoder and the like are not necessary, allowing reduction in chip occupying area. Furthermore, the throughput during detective memory cell repair operation and the repair success rate are improved. Because the faulty row or column is not selected, the access time can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array having a plurality of memory cells arranged in a matrix manner of rows and columns, said row including at least (n+1) lines, where n is an integer, row selecting signal generating means responsive to externally applied row address signals for generating a signal selecting the corresponding row of said memory cell array, said row selecting signal generating means including n row selecting signal output nodes, column selecting means responsive to externally applied column address signals for selecting the corresponding column of said memory cell array, row selecting signal transmitting means provided between said row selecting signal output nodes and said rows of said memory cell array for transmitting the row selecting signal generated from said row selecting signal generating means to the corresponding row, said row selecting signal transmitting means including a plurality of row selecting signal transmission device means provided corresponding to each of said row selecting signal output node, each of said plurality of row selecting signal transmission device means being connected so as to selectively transmit the signal on the corresponding row selecting signal output node to either of the two adjacent rows in succession, whereby a row selecting signal is selectively transmittable to one row from two adjacent row selecting signal transmission device means, connection path defining means for defining the connection path of said row selecting signal transmitting means, said connection path defining means dividing said row selecting signal output nodes into a first group including the row selecting signal output node corresponding to the i-th row and a second group formed of the remaining row selecting signal output nodes, to define the connection path of said row selecting signal transmission device means so that the connection manner of the row selecting signal transmission device means provided corresponding to the row selecting signal output nodes of said first group and the connection manner of the row selecting signal transmission device means provided corresponding to the row selecting signal output nodes of said second group differ from each other, for electrically disconnecting said i-th row from said row selecting signal generating means, in the case a defective memory cell exists in the i-th row of said memory cell array, each of said first and second groups including continuously adjacent row selecting signal output nodes, a plurality of selective connecting devices provided corresponding to each said row of said memory cell array for selectively connecting the corresponding row to a first reference potential, and connection manner defining means responsive to the output of said connection path defining means for defining the connection manner of said plurality of selective connecting devices, said connection manner defining means defining the connection manner of said selective connecting devices so as to connect only the row having said defective memory cell to said reference potential.

2. The semiconductor memory device according to claim 1, wherein:

each of said plurality of row selecting signal transmission device means includes a pair of CMOS transmission gates each connected to a different row, said connection path defining means comprises one voltage supply line provided between said first reference potential and a second reference potential, said voltage supply line being provided with fusable conductive elements corresponding to each said row selecting signal output node, and a plurality of controlling means provided between said fusable conductive elements and said CMOS transmission gates, responsive to the potential of one node of the corresponding fusable conductive element for turning the corresponding one pair of CMOS transmission gates ON and OFF complementally.

3. The semiconductor memory device according to claim 2, wherein each of said selective connecting devices includes switching devices turned ON and OFF in response to the output signal from said controlling means for controlling the ON/OFF of the CMOS transmission gates connected to the related row.

4. A semiconductor memory device comprising, a memory cell array having a plurality of memory cells arranged in a matrix manner of rows and columns, said memory cell array including at least (m+1) columns, where m is an integer, row selecting means responsive to externally applied row address signals for selecting a corresponding row of said memory cell array, column selecting signal generating means responsive to externally applied column address signals for generating a signal to select a corresponding column of said memory cell array, said column selecting signal generating means having m column selecting signal output nodes, at least (m+1) column selecting signal transmission lines, means responsive to the signal potential on said column selecting signal transmission line for selecting a corresponding column of said memory cell array, column selecting signal transmitting means provided between said column selecting signal transmission lines and said column selecting signal output nodes for transmitting the signal potential on said column selecting signal output nodes to the corresponding column selecting signal transmission lines, said column selecting signal transmitting means including a plurality of column selecting signal transmission device means provided corresponding to each of said column selecting signal output nodes, each of said plurality of column selecting signal transmission device means being connected so as to allow selective transmission of the signal on the corresponding column selecting signal output node to either of the two continuously adjacent column selecting signal transmission lines, whereby a column selecting signal is selectively transmitted from the two adjacent column selecting signal transmission device means to one column selecting signal transmission line, connection path defining means for defining the connection path of said column selecting signal transmission device means for repairing a defective memory cell, said connection path defining means dividing said column selecting signal output nodes into a first group including the column selecting signal output node corresponding to an i-th column and a second group formed of the remaining column selecting signal output nodes to define the connection path of said column selecting signal transmission device means so that the connection manner of the column selecting signal transmission device means provided corresponding to said first group of column selecting signal output nodes and the connection manner of the column selecting signal transmission device means provided corresponding to said second group of column selecting signal output nodes differ from each other, for electrically disconnecting said i-th column from said column selecting signal generating means, in the case said defective memory cell exists in said i-th column of said memory cell array, and each of said first and second groups including continuously adjacent column selecting signal output nodes, a plurality of selective connecting device means provided corresponding to each of said column selecting signal transmission lines for selectively connecting the corresponding column selecting signal transmission line to reference potential, and connection manner defining means responsive to the output of said connection path defining means for defining each connection manner of said selective connecting device means, said connection manner defining means connecting only the potential of the column selecting signal transmission line corresponding to said i-th column having said defective memory cell to said reference potential.

5. The semiconductor memory device according to claim 4, wherein each of said plurality of column selecting signal transmission device means includes a pair of CMOS transmission gates each connected to a different column selecting signal transmission line, said connection path defining means comprises one voltage supply line provided between said first reference potential and a second reference potential, said voltage supply line being provided with fusable conductive element corresponding to each of said row selecting signal output node, and a plurality of controlling means provided between said fusable conductive elements and said CMOS transmission gates, responsive to the potential of one node of the corresponding fusable conductive elements for turning the corresponding one pair of CMOS transmission gates ON and OFF complementally.

6. The semiconductor memory device according to claim 5, wherein each of said selective connecting devices includes switching devices turned ON or OFF in response to the output signal from said controlling means for controlling the ON and OFF of the CMOS transmission gates connected to the related row.

7. A semiconductor memory device comprising, a memory cell array having a plurality of memory cells arranged in a matrix manner of rows and columns, said row including at least (n+1) lines, where n is an integer, row selecting signal generating means responsive to externally applied row address signals for generating a signal selecting the corresponding row of said memory cell array, said row selecting signal generating means including n output nodes, a plurality of row selecting signal transmitting means provided corresponding to each of said row selecting signal output node, each of said plurality of row selecting signal transmitting means including a pair of CMOS transmission gates arranged to allow transmission of a row selecting signal to two adjacent rows, one voltage supply line arranged between a first reference potential and a second reference potential, said voltage supply line including a plurality of fusable conductive elements provided in series corresponding to each of said row selecting signal output node, a plurality of controlling means each provided between one fusable conductive device and one row selecting signal transmitting means, responsive to the potential of one node of a related fusable conductive element for turning the corresponding one pair of CMOS transmission gates ON and OFF complementally.

8. The semiconductor memory device according to claim 7, further comprising a plurality of selective connecting devices provided corresponding to each of said rows, responsive to the control signal from the controlling means applied to the CMOS transmission gate connected to the related line for selectively connecting the related row to said first reference potential.

9. A semiconductor memory device comprising, a memory cell array having a plurality of memory cells arranged in a matrix manner of rows and columns, said column including at least (m+1) lines, where m is an integer, column selecting signal generating means responsive to externally applied column address signals for generating a signal selecting the corresponding column of said memory cell array, said column selecting signal generating means including m output nodes, a plurality of column selecting signal lines provided corresponding to each said column, a plurality of column selecting signal transmitting means provided corresponding to each of said column selecting signal output node, each of said plurality of column selecting signal transmitting means including a pair of CMOS transmission gates arranged so as to allow transmission of a column selecting signal to two adjacent column selecting signal transmission lines, column selecting means responsive to the signal potential on said column selecting signal transmission lines for selecting the corresponding column, one voltage supply line arranged between a first reference potential and a second reference potential, said voltage supply line including a plurality of fusable conductive elements provided in series corresponding to each of said column selecting signal output node, and a plurality of controlling means provided between one fusable conductive element and one column selecting signal transmitting means, responsive to the potential of one node of the related fusable conductive element for turning the corresponding one pair of CMOS transmission gates ON and OFF complementally.

10. The semiconductor memory device according to claim 9, further comprising a plurality of selective connecting devices provided corresponding to each of said rows, each responsive to the control signal from the controlling means applied to the CMOS transmission gate connected to the related row, for selectively connecting the related row selecting signal line to said first reference potential.

11. A method of repairing a defective memory cell in a semiconductor memory device comprising a memory cell array arranged in a matrix manner of rows and columns, and a row selecting signal generating circuit responsive to an external address signal for generating a signal selecting a row of said memory cell array, said memory cell array having at least $(n+1)$ rows, and said row selecting signal generating circuit having n row selecting signal output nodes, where n is an integer, comprising the steps of:

when a defective memory cell exists, grouping the row selecting signal output nodes into a first group including row selecting signal output nodes corresponding to the row including the defective memory cell and a second group of the remaining output nodes, connecting the output nodes of the second group with the corresponding rows in a manner identical to that of no defective memory cells, while shifting the output nodes of the first group by one line for connecting to the remaining rows, and connecting only the row including said defective memory cell to a reference potential fixedly.

12. A method of repairing a defective memory cell in a semiconductor memory device comprising a memory cell array having a memory cell array arranged in a matrix manner of rows and columns, column selecting signal generating circuit responsive to an external column address signal for generating a column selecting signal, column selecting signal transmission lines for receiving the column selecting signal, and column selecting means responsive to the signal potential on the column selecting signal transmission lines for selecting the corresponding column of said memory cell array, said memory cell array including at least $(m+1)$ columns, said column selecting signal transmission lines being provided with at least $(m+1)$ lines of said columns, and said column selecting signal generating circuit including m column selecting signal output nodes, where m is an integer, comprising the steps of:

when a defective memory cell exists, grouping said column selecting signal output nodes into a first group including the column selecting signal output node corresponding to the column including the defective memory cell and a second group formed of the remaining output nodes, connecting the second group output nodes with the corresponding column selecting signal transmission lines in a connection manner similar to that in the case of no defective cell, while shifting the output nodes of the first group by one line for connecting to the column selecting signal transmission lines, and connecting only the column selecting signal transmission line related to the column including the defective memory cell to the reference potential fixedly.

* * * * *